(12) United States Patent
Lim et al.

(10) Patent No.: US 11,409,197 B2
(45) Date of Patent: Aug. 9, 2022

(54) HARDMASK COMPOSITION, HARDMASK LAYER AND METHOD OF FORMING PATTERNS

(71) Applicant: SAMSUNG SDI CO., LTD., Yongin-si (KR)

(72) Inventors: Jaebum Lim, Yongin-si (KR); Sunghwan Kim, Yongin-si (KR); Seunghyun Kim, Yongin-si (KR); Taeho Kim, Yongin-si (KR); Yushin Park, Yongin-si (KR); Sunyoung Yang, Yongin-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 185 days.

(21) Appl. No.: 16/722,720

(22) Filed: Dec. 20, 2019

(65) Prior Publication Data

US 2020/0201185 A1 Jun. 25, 2020

(30) Foreign Application Priority Data

Dec. 21, 2018 (KR) .................. 10-2018-0167677

(51) Int. Cl.
| | | |
|---|---|---|
| *G03F 7/11* | (2006.01) | |
| *C09D 7/63* | (2018.01) | |
| *G03F 7/30* | (2006.01) | |
| *G03F 7/20* | (2006.01) | |
| *G03F 7/16* | (2006.01) | |

(52) U.S. Cl.
CPC .................. *G03F 7/11* (2013.01); *C09D 7/63* (2018.01); *G03F 7/162* (2013.01); *G03F 7/20* (2013.01); *G03F 7/30* (2013.01)

(58) Field of Classification Search
CPC ... G03F 7/11; G03F 7/162; G03F 7/20; G03F 7/30; G03F 7/094; G03F 7/004; G03F 7/0035; G03F 7/09; C09D 7/63; H01L 21/0271; H01L 21/02216; H01L 21/324; C07C 39/17
USPC ...................... 430/320, 311, 270.1
See application file for complete search history.

(56) References Cited

U.S. PATENT DOCUMENTS

| | | | |
|---|---|---|---|
| 5,972,247 A | 10/1999 | Shi et al. | |
| 6,461,747 B1 * | 10/2002 | Okada .................. | C07D 471/04 252/301.16 |
| 2003/0039858 A1 | 2/2003 | Igarashi et al. | |
| 2004/0232409 A1 | 11/2004 | Igarashi et al. | |
| 2009/0081582 A1 | 3/2009 | Hattori et al. | |
| 2010/0021830 A1 | 1/2010 | Kim et al. | |
| 2012/0153511 A1 | 6/2012 | Song et al. | |
| 2012/0273768 A1 | 11/2012 | Ikeda et al. | |
| 2015/0059854 A1 | 3/2015 | Shiba et al. | |
| 2015/0166711 A1 | 6/2015 | Cui et al. | |
| 2015/0187566 A1 | 7/2015 | Park et al. | |
| 2015/0274622 A1 | 10/2015 | Kim et al. | |
| 2016/0017174 A1 | 1/2016 | Nam et al. | |
| 2018/0158674 A1 | 6/2018 | Yamada et al. | |
| 2019/0393427 A1 | 12/2019 | Moon et al. | |
| 2020/0044158 A1 | 2/2020 | Nakasugi et al. | |

FOREIGN PATENT DOCUMENTS

| | | |
|---|---|---|
| JP | 11312588 A | 11/1999 |
| JP | 2004535051 A | 11/2004 |
| JP | 40003824 | 8/2007 |
| JP | 2009080203 A | 4/2009 |
| JP | 2015125843 A | 7/2015 |
| JP | 6130757 | 4/2017 |
| JP | 2018100249 A | 6/2018 |
| KR | 10-0866015 | 10/2008 |
| KR | 10-2012-0067602 A | 6/2012 |
| KR | 10-2012-0068379 A | 6/2012 |
| KR | 10-1225945 | 1/2013 |
| KR | 10-1225946 | 1/2013 |
| KR | 10-1344793 | 12/2013 |
| KR | 10-2016-0008927 A | 1/2016 |
| KR | 10-2018-0064286 | 6/2018 |

(Continued)

OTHER PUBLICATIONS

Japanese Office action dated Feb. 2, 2021.

(Continued)

*Primary Examiner* — Caleen O Sullivan
(74) *Attorney, Agent, or Firm* — Lee IP Law, P.C.

(57) ABSTRACT

A hardmask composition, a hardmask layer, and a method of forming patterns, the composition including a solvent; and a compound represented by Chemical Formula 1,

[Chemical Formula 1]
$$A\text{---}(B)_n$$

wherein, in Chemical Formula 1, A is a C6 to C30 aromatic moiety, n is an integer of 2 or more, and each B is independently a group represented by Chemical Formula 2,

[Chemical Formula 2]

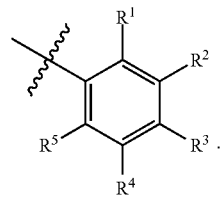

10 Claims, No Drawings

(56) References Cited

FOREIGN PATENT DOCUMENTS

| | | |
|---|---|---|
| TW | 201229672 A | 7/2012 |
| TW | 201525057 A | 7/2015 |
| WO | WO 2011/055529 A1 | 5/2011 |
| WO | WO 2014-104496 A1 | 7/2014 |
| WO | WO 2018/151470 A1 | 8/2018 |

OTHER PUBLICATIONS

Taiwanese Office Action dated Aug. 19, 2020 with Search Report dated Aug. 12, 2020.
Korean Notice of Allowance dated Feb. 7, 2022.

\* cited by examiner

HARDMASK COMPOSITION, HARDMASK LAYER AND METHOD OF FORMING PATTERNS

CROSS-REFERENCE TO RELATED APPLICATION

Korean Patent Application No. 10-2018-0167677, filed on Dec. 21, 2018, in the Korean Intellectual Property Office, and entitled: "Hardmask Composition, Hardmask Layer, and Method of Forming Patterns," is incorporated by reference herein in its entirety.

BACKGROUND

1. Field

Embodiments relate to a hardmask composition, a hardmask layer, and a method of forming patterns.

2. Description of the Related Art

Recently, the semiconductor industry has developed to an ultra-fine technique having a pattern of several to several tens of nanometer size. Such ultrafine technique uses effective lithographic techniques. Lithographic techniques may include providing a material layer on a semiconductor substrate; coating a photoresist layer thereon; exposing and developing the same to provide a photoresist pattern; and etching a material layer using the photoresist pattern as a mask.

SUMMARY

The embodiments may be realized by providing a hardmask composition including a solvent; and a compound represented by Chemical Formula 1,

[Chemical Formula 1]

wherein, in Chemical Formula 1, A is a C6 to C30 aromatic moiety, n is an integer of 2 or more, and each B is independently a group represented by Chemical Formula 2,

[Chemical Formula 2]

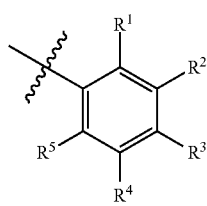

wherein, in Chemical Formula 2, $R^1$ to $R^5$ are independently hydrogen, a substituted or unsubstituted C6 to C30 aryl group, a substituted or unsubstituted C3 to C30 heteroaryl group, or a combination thereof, at least one of $R^1$ to $R^5$ is a substituted or unsubstituted C3 to C30 heteroaryl group; or a C6 to C30 aryl group substituted with a hydroxy group, an amino group, a mercapto group, a substituted or unsubstituted C1 to C30 alkoxy group, a substituted or unsubstituted C1 to C30 alkylthio group, or a substituted or unsubstituted C1 to C20 alkylamino group, $R^1$ to $R^5$ are separate or an adjacent two thereof are linked with each other to form a ring, and

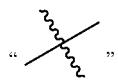

is a linking point with A in Chemical Formula 1.

A may be a benzene moiety, a naphthalene moiety, an anthracene moiety, a tetracene moiety, a pentacene moiety, a biphenyl moiety, a terphenyl moiety, a quaterphenyl moiety, a quinquephenyl moiety, a phenanthrene moiety, a pyrene moiety, a fluoranthene moiety, a benzophenanthrene moiety, a chrysene moiety, a perylene moiety, a benzopyrene moiety, a picene moiety, a benzofluoranthene moiety, a dibenzofluoranthene moiety, a benzoperylene moiety, a coronene moiety, a naphthoanthracene moiety, or a triphenylene moiety.

A may be a moiety of a compound of Group 1:

[Group 1]

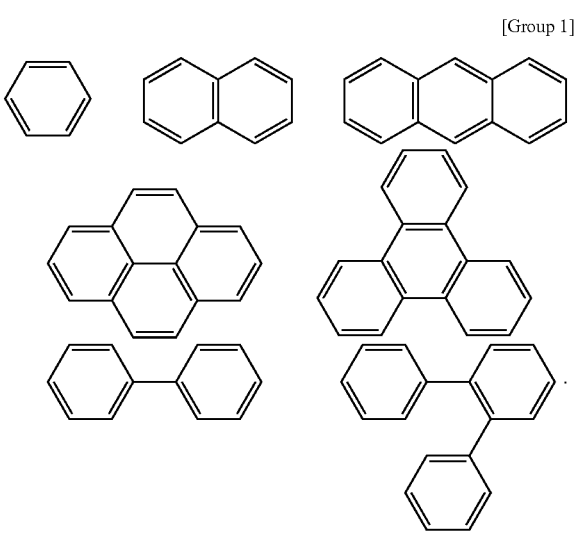

The substituted or unsubstituted C6 to C30 aryl group may be a substituted or unsubstituted phenyl group, a substituted or unsubstituted naphthyl group, a substituted or unsubstituted anthracenyl group, a substituted or unsubstituted tetracenyl group, a substituted or unsubstituted pentacenyl group, a substituted or unsubstituted biphenyl group, a substituted or unsubstituted terphenyl group, a substituted or unsubstituted quaterphenyl group, a substituted or unsubstituted quinquephenyl group, a substituted or unsubstituted phenanthrenyl group, a substituted or unsubstituted chrysenyl group, a substituted or unsubstituted picenyl group, a substituted or unsubstituted triphenylenyl group, a substituted or unsubstituted pyrenyl group, a substituted or unsubstituted fluorenyl group, a substituted or unsubstituted fluoranthenyl group, a substituted or unsubstituted acenaphthylenyl group, a substituted or unsubstituted acenaphthenyl group, a substituted or unsubstituted benzophenanthrenyl group, a substituted or unsubstituted benzofluoranthenyl group, a substituted or unsubstituted perylenyl group, a substituted or unsubstituted benzopyrenyl group, a substituted or unsubstituted naphthoanthracenyl group, a substituted or unsubstituted benzoperylenyl group, a substituted or unsubstituted dibenzopyrenyl group, a substituted or unsubstituted coronenyl group, or a combination thereof, and the substituted or unsubstituted C3 to C30 heteroaryl group may be a substituted or unsubstituted pyrrolyl group, a substituted or unsubstituted indolo group, a substituted or unsubstituted carbazolyl group, a substituted or unsubstituted furanyl group, a substituted or unsubstituted benzofuranyl group, a substituted or unsubstituted dibenzofuranyl group, a substituted or unsubstituted thiophenyl group, a substituted or unsubstituted benzothiophenyl group, a substituted or unsubstituted dibenzothiophenyl group, a substituted or unsubstituted pyridinyl group, a substituted or unsubstituted pyrimidyl group, a substituted or unsubstituted triazinyl group, a substituted or unsubstituted imidazolyl group, a substituted or unsubstituted pyrazolyl group, a substituted or unsubstituted isoindolo group, a substituted or unsubstituted benzimidazolyl group, a substituted or unsubstituted indazolyl group, a substituted or unsubstituted oxazolyl group, a substituted or unsubstituted thiazolyl group, or a combination thereof.

$R^1$ to $R^5$ may each independently be hydrogen, a substituted or unsubstituted aryl group of Group 2, or a substituted or unsubstituted heteroaryl group of Group 3:

[Group 2]

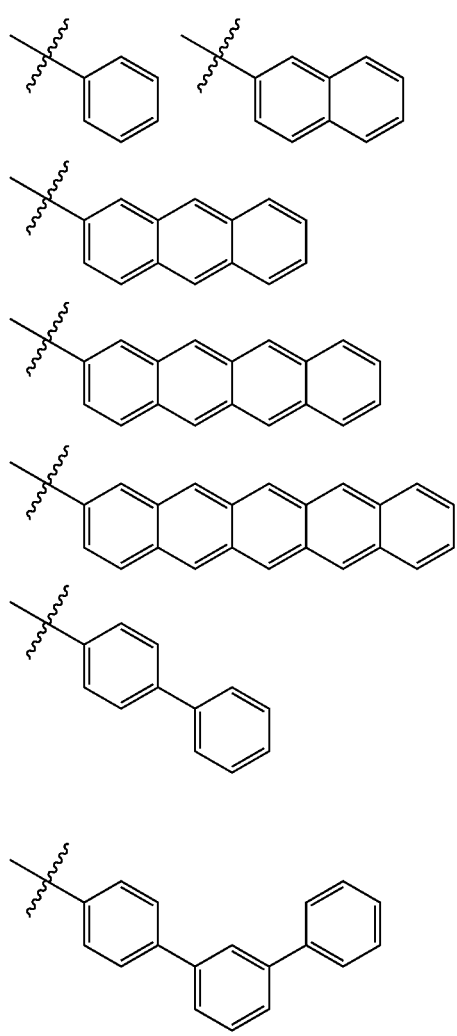

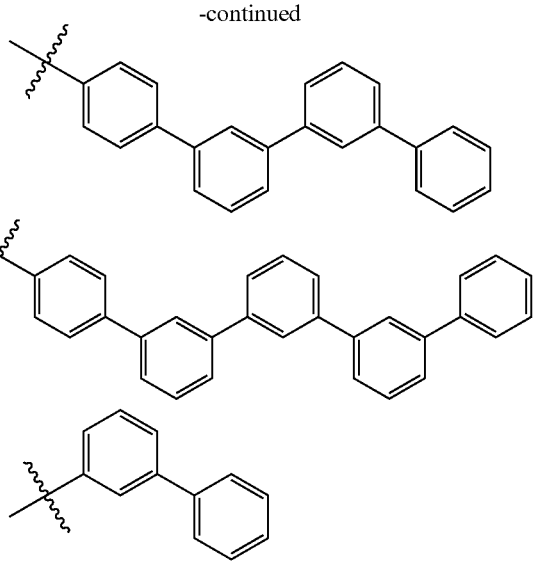

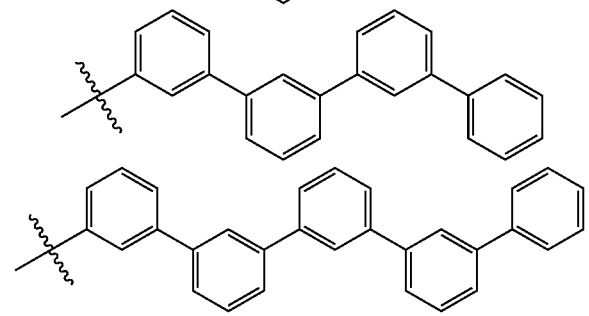

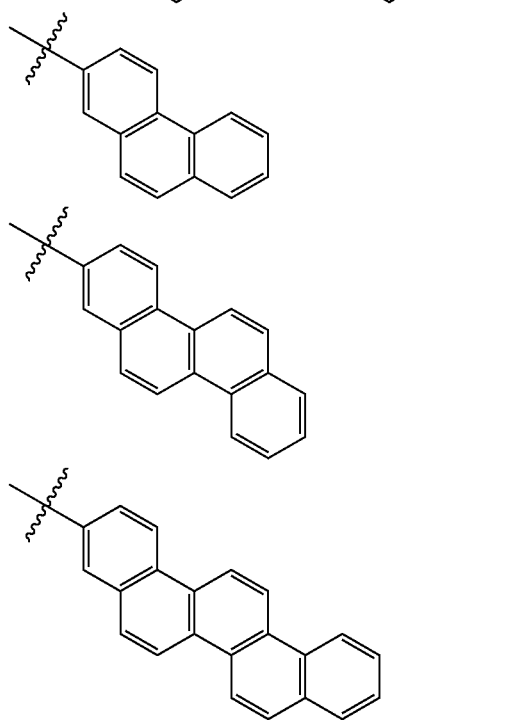

-continued

-continued

[Group 3]

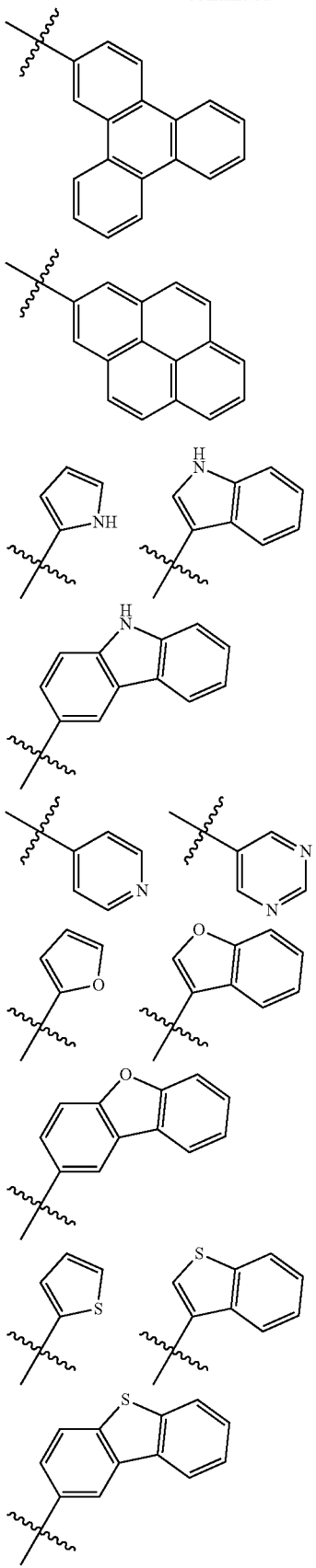

wherein, in Group 2 and Group 3,

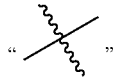

is a linking point.

At least one of $R^1$ to $R^5$ may be a substituted or unsubstituted heteroaryl group of Group 3; or an aryl group of Group 2 substituted with a hydroxy group, an amino group, a mercapto group, a substituted or unsubstituted C1 to C30 alkoxy group, a substituted or unsubstituted C1 to C30 alkylthiol group, or a substituted or unsubstituted C1 to C20 alkylamino group.

The group represented by Chemical Formula 2 may be represented by one of Chemical Formulae 3-1 to 3-4:

[Chemical Formula 3-1]

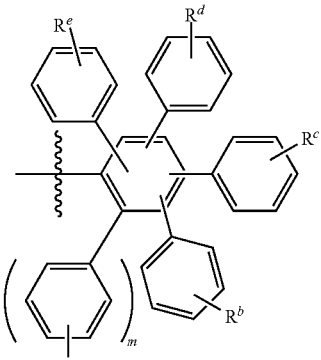

[Chemical Formula 3-2]

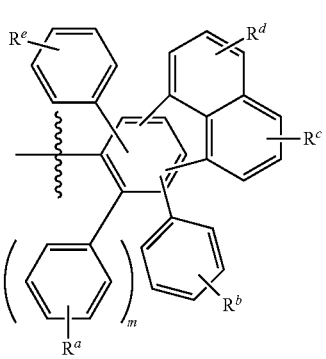

[Chemical Formula 3-3]

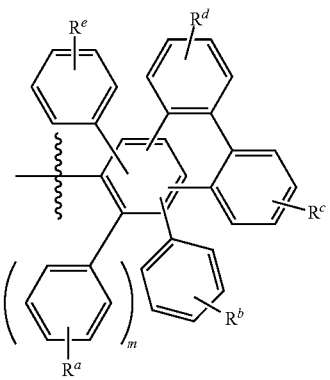

[Chemical Formula 3-4]

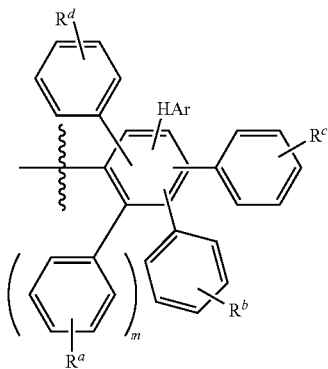

wherein, in Chemical Formulae 3-1 to 3-4, $R^a$ to $R^e$ may each independently be hydrogen, a hydroxy group, an amino group, a mercapto group, a substituted or unsubstituted C1 to C30 alkoxy group, a substituted or unsubstituted C1 to C30 alkylthiol group, or a substituted or unsubstituted C1 to C20 alkylamino group, at least one of $R^a$ to $R^e$ may be a hydroxy group, an amino group, a mercapto group, a substituted or unsubstituted C1 to C30 alkoxy group, a substituted or unsubstituted C1 to C30 alkylthiol group, or a substituted or unsubstituted C1 to C20 alkylamino group, HAr may be a substituted or unsubstituted C3 to C30 heteroaryl group including N, O, or S, m may be 0 or 1, and

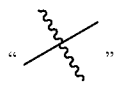

is a linking point with A in Chemical Formula 1.

n may be an integer satisfying 2≤n≤k/2, in which k is a number of substitutable positions of A in Chemical Formula 1.

The compound represented by Chemical Formula 1 may be represented by one of Chemical Formulae 4-1 to 4-4:

[Chemical Formula 4-1]

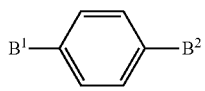

[Chemical Formula 4-2]

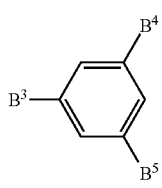

[Chemical Formula 4-3]

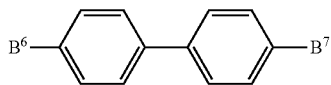

[Chemical Formula 4-4]

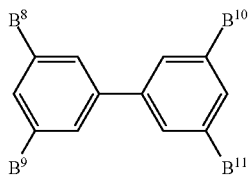

wherein, in Chemical Formula 4-1 to Chemical Formula 4-4, $B^1$ to $B^{11}$ may each independently be a group represented by Chemical Formula 2.

The embodiments may be realized by providing a hardmask layer comprising a cured product of the hardmask composition according to an embodiment.

The cured product may include a condensed polycyclic aromatic hydrocarbon.

The embodiments may be realized by providing a method of forming patterns, the method including applying the hardmask composition according to an embodiment on a material layer and heat-treating the resultant to form a hardmask layer; forming a photoresist layer on the hardmask layer; exposing and developing the photoresist layer to form a photoresist pattern; selectively removing the hardmask layer using the photoresist pattern to expose a portion of the material layer; and etching an exposed portion of the material layer.

DETAILED DESCRIPTION

Example embodiments will now be described more fully hereinafter; however, they may be embodied in different forms and should not be construed as limited to the embodiments set forth herein. Rather, these embodiments are provided so that this disclosure will be thorough and complete, and will fully convey exemplary implementations to those skilled in the art.

It will also be understood that when a layer or element is referred to as being "on" another layer or element, it can be directly on the other layer or element, or intervening layers may also be present. In addition, it will also be understood that when a layer is referred to as being "between" two layers, it can be the only layer between the two layers, or one or more intervening layers may also be present. As used herein, the term "or" is not an exclusive term, e.g., "A or B" would include A, B, or A and B.

As used herein, when a definition is not otherwise provided, "substituted" refers to replacement of a hydrogen atom of a compound by a substituent selected from deuterium, a halogen atom (F, Br, Cl, or I), a hydroxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, a C1 to C30 alkyl group, a C2 to C30 alkenyl group, a C2 to C30 alkynyl group, a C6 to C30 aryl group, a C7 to C30 arylalkyl group, a C1 to C30 alkoxy group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C2 to C30 heterocyclic group, and a combination thereof.

In addition, two adjacent substituents of the substituted halogen atom (F, Br, Cl, or I), hydroxy group, nitro group, cyano group, amino group, azido group, amidino group, hydrazino group, hydrazono group, carbonyl group, carbamyl group, thiol group, ester group, carboxyl group or salt thereof, sulfonic acid group or salt thereof, phosphoric acid group or salt thereof, C1 to C30 alkyl group, C2 to C30 alkenyl group, C2 to C30 alkynyl group, C6 to C30 aryl group, C7 to C30 arylalkyl group, C1 to C30 alkoxy group, C1 to C20 heteroalkyl group, C3 to C20 heteroarylalkyl group, C3 to C30 cycloalkyl group, C3 to C15 cycloalkenyl group, C6 to C15 cycloalkynyl group, and C2 to C30 heterocyclic group may be fused to form a ring. For example, the substituted C6 to C30 aryl group may be fused with another adjacent substituted C6 to C30 aryl group to form a substituted or unsubstituted fluorene ring.

As used herein, when a definition is not otherwise provided, "hetero" refers to one including 1 to 3 heteroatoms selected from N, O, S, Se, and P.

As used herein, "aryl group" may refer to a group including at least one hydrocarbon aromatic moiety, and includes hydrocarbon aromatic moieties linked by a single bond and hydrocarbon aromatic moieties fused directly or indirectly to provide a non-aromatic fused ring. The aryl group may include a monocyclic, polycyclic, or fused polycyclic (i.e., rings sharing adjacent pairs of carbon atoms) functional group.

As used herein, "heterocyclic group" is a concept including a heteroaryl group, and may include at least one hetero atom selected from N, O, S, P, and Si instead of carbon (C) in a cyclic compound such as an aryl group, a cycloalkyl group, a fused ring thereof, or a combination thereof. When the heterocyclic group is a fused ring, the entire ring or each ring of the heterocyclic group may include one or more heteroatoms.

More specifically, the substituted or unsubstituted aryl group and/or the substituted or unsubstituted heterocyclic group may be a substituted or unsubstituted phenyl group, a substituted or unsubstituted naphthyl group, a substituted or unsubstituted anthracenyl group, a substituted or unsubstituted phenanthryl group, a substituted or unsubstituted naphthacenyl group, a substituted or unsubstituted pyrenyl group, a substituted or unsubstituted biphenyl group, a substituted or unsubstituted terphenyl group, a substituted or unsubstituted quaterphenyl group, a substituted or unsubstituted chrysenyl group, a substituted or unsubstituted triphenylenyl group, a substituted or unsubstituted perylenyl group, a substituted or unsubstituted indenyl group, a substituted or unsubstituted furanyl group, a substituted or unsubstituted thiophenyl group, a substituted or unsubstituted pyrrolyl group, a substituted or unsubstituted pyrazolyl group, a substituted or unsubstituted imidazolyl group, a substituted or unsubstituted triazolyl group, a substituted or unsubstituted oxazolyl group, a substituted or unsubstituted thiazolyl group, a substituted or unsubstituted oxadiazolyl group, a substituted or unsubstituted thiadiazolyl group, a substituted or unsubstituted pyridinyl group, a substituted or unsubstituted pyrimidinyl group, a substituted or unsubstituted pyrazinyl group, a substituted or unsubstituted triazinyl group, a substituted or unsubstituted benzofuranyl group, a substituted or unsubstituted benzothiophenyl group, a substituted or unsubstituted benzimidazolyl group, a substituted or unsubstituted indolyl group, a substituted or unsubstituted quinolinyl group, a substituted or unsubstituted isoquinolinyl group, a substituted or unsubstituted quinazolinyl group, a substituted or unsubstituted quinoxalinyl group, a substituted or unsubstituted naphthyridinyl group, a substituted or unsubstituted benzoxazinyl group, a substituted or unsubstituted benzthiazinyl group, a substituted or unsubstituted acridinyl group, a substituted or unsubstituted phenazinyl group, a substituted or unsubstituted phenothiazinyl group, a substituted or unsubstituted phenoxazinyl group, a substituted or unsubstituted fluorenyl group, a substituted or unsubstituted dibenzofuranyl group, a substituted or unsubstituted dibenzothiophenyl group, a substituted or unsubstituted carbazolyl group, a substituted or unsubstituted pyridoindolyl group, a substituted or unsubstituted benzopyridooxazinyl group, a substituted or unsubstituted benzopyridothiazinyl group, a substituted or unsubstituted 9,9-dimethyl 9,10 dihydroacridinyl group, a substituted or unsubstituted combination thereof, or a combined fused ring of the foregoing groups. In one example, the heterocyclic group or the heteroaryl group may be a pyridyl group, a carbazolyl group, or a pyridoindolyl group.

Hereinafter, a hardmask composition according to an embodiment is described.

A hardmask composition according to an embodiment may include, e.g., a compound and a solvent.

The compound may include, e.g., a core A that is an aromatic moiety, and the core A may be substituted with a substituent (B), a substituted or unsubstituted aromatic moiety. The substituent (B) may be a substituted or unsubstituted phenyl group, e.g., a phenyl group substituted with a substituted or unsubstituted aryl group, a substituted or unsubstituted heteroaryl group, or a combination thereof. In an implementation, B may be, e.g., a phenyl group substituted with a substituted or unsubstituted heteroaryl group or an aryl group substituted with at least one hydrophilic group.

For example, the compound may be represented by Chemical Formula 1.

[Chemical Formula 1]

In Chemical Formula 1,
A may be, e.g., a C6 to C30 aromatic moiety,
each B may independently be, e.g., a group represented by Chemical Formula 2, and
n may be an integer of 2 or more. In an implementation, n is less than or equal to a total number of substitutable positions of A.

[Chemical Formula 2]

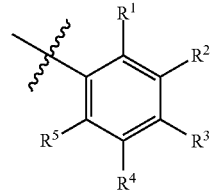

In Chemical Formula 2, $R^1$ to $R^5$ may each independently be or include, e.g., hydrogen, a substituted or unsubstituted C6 to C30 aryl group, a substituted or unsubstituted C3 to C30 heteroaryl group, or a combination thereof.

In an implementation, at least one of $R^1$ to $R^5$ may be, e.g., a substituted or unsubstituted C3 to C30 heteroaryl group; or a C6 to C30 aryl group substituted with a hydroxy group, an amino group, a mercapto group, a substituted or unsubstituted C1 to C30 alkoxy group, a substituted or unsubstituted C1 to C30 alkylthiol group, or a substituted or unsubstituted C1 to C20 alkylamino group.

In an implementation, $R^1$ to $R^5$ may be separate or an adjacent two thereof may be linked with each other to form a ring.

" 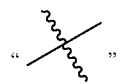 "

is a linking point with A in Chemical Formula 1.
In an implementation, the compound represented by Chemical Formula 1 may be synthesized through a Diels- Alder reaction and an elimination reaction using a compound having a substituted diene and a substituted ethynyl moiety as reactant. The compound represented by Chemical Formula 1 may include a functional group that is disadvantageous to the Diels-Alder reaction, e.g., a hydroxy group, an amino group, a mercapto group, a substituted or unsubstituted C1 to C30 alkoxy group, a substituted or unsubstituted C1 to C30 alkylthiol group, or a substituted or unsubstituted C1 to C20 alkylamino group.

In an implementation, the compound may be obtained from, e.g., compounds including C≡C triple bonds and cyclopentadienes.

In an implementation, A may be an uncondensed aromatic moiety; a condensed aromatic moiety; a moiety including aromatic moieties linked with a single bond; a moiety including rings condensed on two sides that are not parallel to each other in the benzene ring, and fused each other; a moiety including rings condensed on two sides that are not parallel to each other in the benzene ring, and linked with a single bond or a double bond, or a combination thereof.

In an implementation, A may be, e.g., a benzene moiety, a naphthalene moiety, an anthracene moiety, a tetracene moiety, a pentacene moiety, a biphenyl moiety, a terphenyl moiety, a quaterphenyl moiety, a quinquephenyl moiety, a phenanthrene moiety, a pyrene moiety, a fluoranthene moiety, a benzophenanthrene moiety, a chrysene moiety, a perylene moiety, a benzopyrene moiety, a picene moiety, a benzofluoranthene moiety, a dibenzofluoranthene moiety, a benzoperylene moiety, a coronene moiety, a naphthoanthracene moiety, or a triphenylene moiety.

The compound may include the aforementioned aromatic moiety in core A, and it may increase a carbon content of the compound and form a rigid layer, thus giving high etch resistance.

In an implementation, A may be a benzene moiety or a moiety in which benzene moieties are linked with a single bond, e.g., a benzene moiety, a biphenyl moiety, an ortho-terphenyl moiety, a meta-terphenyl moiety, or a para-terphenyl moiety.

In an implementation, the compound may include the benzene moiety or the moiety linked with the benzene moiety with the single bond in the core A and accordingly, may secure high rotation degree of freedom and thus may form a rigid layer as well as further increase solubility in a solvent and resultantly, may impart much higher heat resistance and high etch resistance.

In an implementation, A may be a moiety of the compounds of Group 1.

[Group 1]

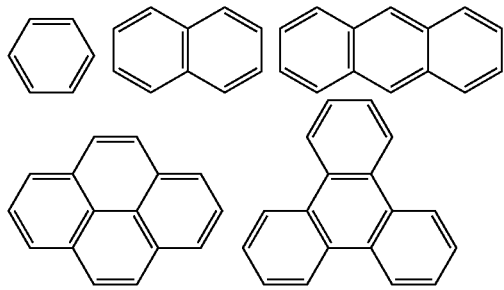

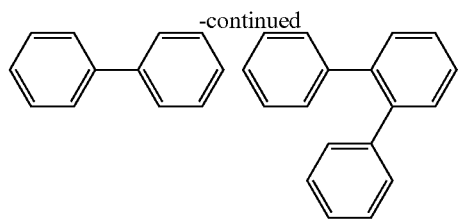

-continued

In an implementation, the compound has substituents (B) each independently represented by Chemical Formula 2 on the core A. In an implementation, a fused structure may be formed by a reaction of the aromatic moieties of core A with the substituents (B) linked thereto upon curing of the compound, thereby forming a hard-film condensed polycyclic aromatic hydrocarbon.

In an implementation, B may be the same substituents (e.g., each B bracketed by n may be the same).

In an implementation, in Chemical Formula 2, a substituent of the substituted C6 to C30 aryl group and the substituted C3 to C30 heteroaryl group of $R^1$ to $R^5$ may be, e.g., a hydroxy group, a mercapto group, a substituted or unsubstituted C1 to C30 alkylthiol group, a C1 to C30 alkyl group, a C1 to C30 alkoxy group, a C2 to C30 alkenyl group, a C2 to C30 alkynyl group, a C6 to C30 aryl group, a C7 to C30 arylalkyl group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C2 to C30 heterocyclic group, a C1 to C30 ester group, a C0 to C30 amino group, a C1 to C30 thioester group, a C1 to C30 sulfone group, a halogen, or a combination thereof.

In an implementation, in Chemical Formula 2, the substituted or unsubstituted C6 to C30 aryl group of $R^1$ to $R^5$ may be, e.g., a substituted or unsubstituted phenyl group, a substituted or unsubstituted naphthyl group, a substituted or unsubstituted anthracenyl group, a substituted or unsubstituted tetracenyl group, a substituted or unsubstituted pentacenyl group, a substituted or unsubstituted biphenyl group, a substituted or unsubstituted terphenyl group, a substituted or unsubstituted quaterphenyl group, a substituted or unsubstituted quinquephenyl group, a substituted or unsubstituted phenanthrenyl group, a substituted or unsubstituted chrysenyl group, a substituted or unsubstituted picenyl group, a substituted or unsubstituted triphenylenyl group, a substituted or unsubstituted pyrenyl group, a substituted or unsubstituted fluorenyl group, a substituted or unsubstituted fluoranthenyl group, a substituted or unsubstituted acenaphthylenyl group, a substituted or unsubstituted acenaphthenyl group, a substituted or unsubstituted benzophenanthrenyl group, a substituted or unsubstituted benzofluoranthenyl group, a substituted or unsubstituted perylenyl group, a substituted or unsubstituted benzopyrenyl group, a substituted or unsubstituted naphthoanthracenyl group, a substituted or unsubstituted benzoperylenyl group, a substituted or unsubstituted dibenzopyrenyl group, a substituted or unsubstituted coronenyl group, or a combination thereof.

In an implementation, in Chemical Formula 2, the substituted or unsubstituted C3 to C30 heteroaryl group of $R^1$ to $R^5$ may be, e.g., a substituted or unsubstituted pyrrolyl group, a substituted or unsubstituted indolo group, a substituted or unsubstituted carbazolyl group, a substituted or unsubstituted furanyl group, a substituted or unsubstituted benzofuranyl group, a substituted or unsubstituted dibenzofuranyl group, a substituted or unsubstituted thiophenyl group, a substituted or unsubstituted benzothiophenyl group, a substituted or unsubstituted dibenzothiophenyl group, a substituted or unsubstituted pyridinyl group, a substituted or unsubstituted pyrimidyl group, a substituted or unsubstituted triazinyl group, a substituted or unsubstituted imidazolyl group, a substituted or unsubstituted pyrazolyl group, a substituted or unsubstituted isoindolo group, a substituted or unsubstituted benzimidazolyl group, a substituted or unsubstituted indazolyl group, a substituted or unsubstituted oxazolyl group, a substituted or unsubstituted thiazolyl group, or a combination thereof.

In an implementation, in Chemical Formula 2, the substituted or unsubstituted C6 to C30 aryl group of $R^1$ to $R^5$ may be, e.g., may be a substituted or unsubstituted C6 to C30 condensed aryl group or a substituted or unsubstituted C6 to C30 uncondensed aryl group, and the substituted or unsubstituted C3 to C30 heteroaryl group of $R^1$ to $R^5$ may be, e.g., a substituted or unsubstituted C3 to C30 condensed heteroaryl group, or a substituted or unsubstituted C3 to C30 uncondensed heteroaryl group. In an implementation, the substituted or unsubstituted C6 to C30 aryl group may be, e.g., a substituted or unsubstituted C6 to C30 uncondensed aryl group, and the substituted or unsubstituted C3 to C30 heteroaryl group may be, e.g., a substituted or unsubstituted C3 to C30 uncondensed heteroaryl group. For example, the compound may secure high rotation degree of freedom and thus may form a rigid layer as well as greatly increase solubility in a solvent and accordingly, may impart much higher heat resistance and etch resistance.

In an implementation, $R^1$ to $R^5$ may each independently be, e.g., hydrogen, a substituted or unsubstituted aryl group of a group of Group 2 or a substituted or unsubstituted heteroaryl group of a group of Group 3.

[Group 2]

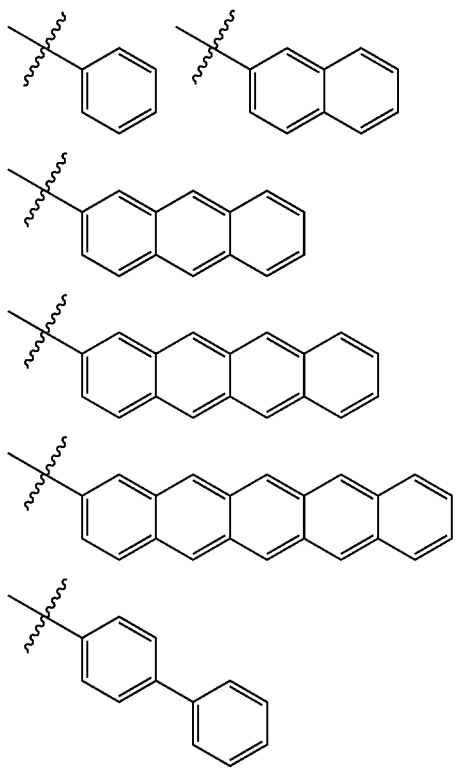

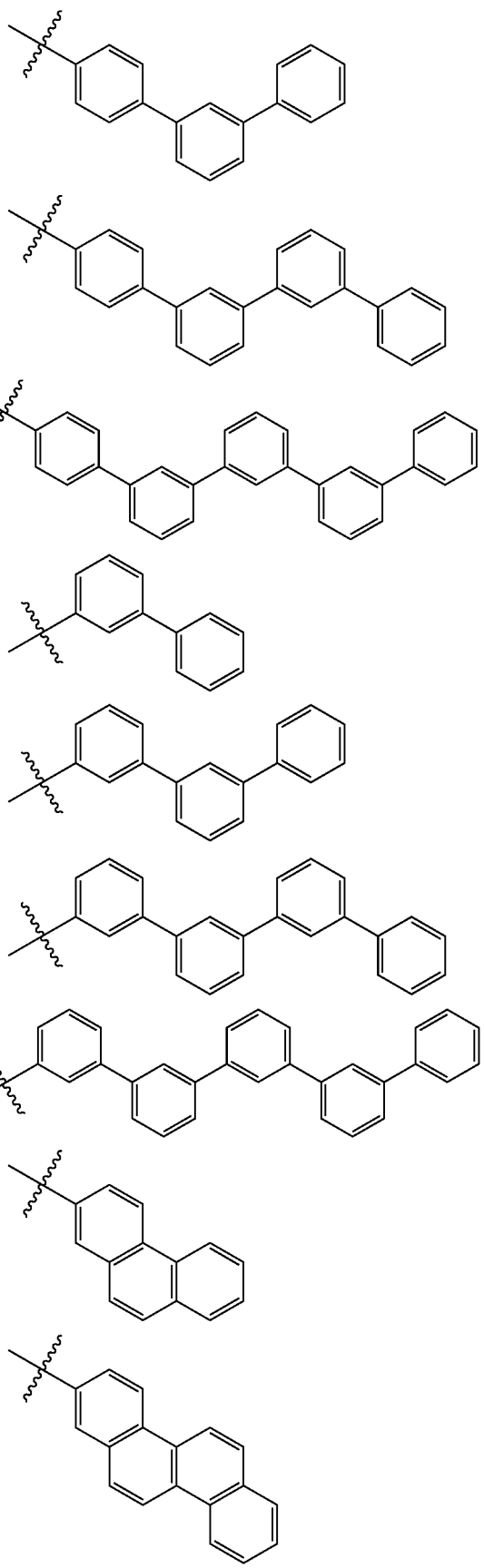

-continued

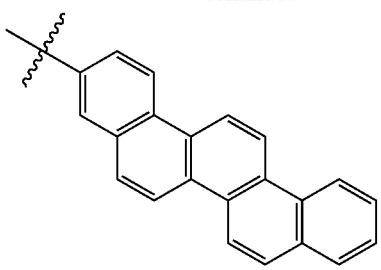

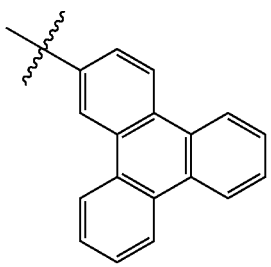

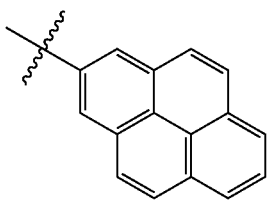

[Group 3]

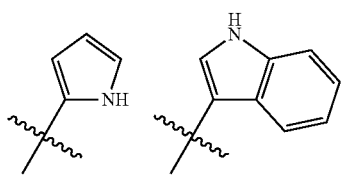

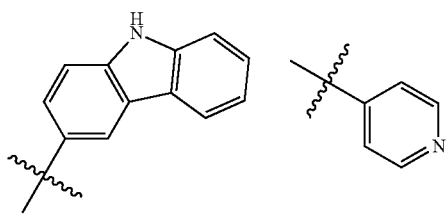

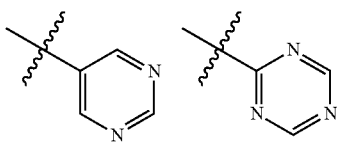

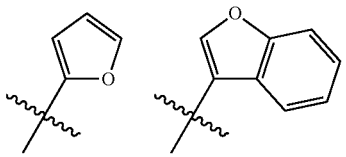

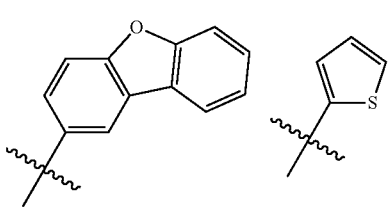

-continued

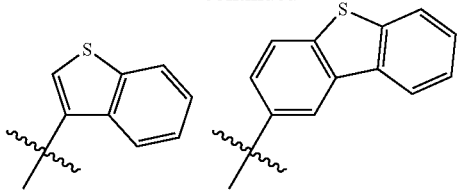

In Group 2 and Group 3,

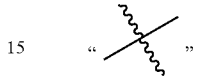

is a linking point.

In an implementation, at least one of $R^1$ to $R^5$ may be, e.g., a substituted or unsubstituted C3 to C30 heteroaryl group; or a C6 to C30 aryl group substituted with a hydroxy group, an amino group, a mercapto group, a substituted or unsubstituted C1 to C30 alkoxy group, a substituted or unsubstituted C1 to C30 alkylthiol group, or a substituted or unsubstituted C1 to C20 alkylamino group. For example, it may be more effectively applied to a solution processes such as spin coating due to increased solubility in a solvent, and an affinity for a lower layer may be increased during coating and curing, and film flatness of the layer produced therefrom may be further improved. In addition, it may have high etch resistance and chemical resistance and may withstand the etching gas and chemicals exposed in subsequent processes such as the etching process.

In an implementation, at least one of $R^1$ to $R^5$ may be, e.g., a substituted or unsubstituted heteroaryl group of a group of Group 3; or a substituted aryl group of a group of Group 2 that is substituted with a hydroxy group, an amino group, a mercapto group, a substituted or unsubstituted C1 to C30 alkoxy group, a substituted or unsubstituted C1 to C30 alkylthiol group, or a substituted or unsubstituted C1 to C20 alkylamino group.

In an implementation, at least one of $R^1$ to $R^5$ may be, e.g., a hydroxyphenyl group, a hydroxynaphthyl group, a hydroxyanthracenyl group, a hydroxytetracenyl group, a hydroxypentacenyl group, a hydroxybiphenyl group, a hydroxyterphenyl group, a hydroxyquaterphenyl group, a hydroxyquinquephenyl group, a hydroxyphenanthrenyl group, a hydroxychrysenyl group, a hydroxypicenyl group, a hydroxytriphenylenyl group, a hydroxypyrenyl group, a hydroxyfluorenyl group, a hydroxyfluoranthenyl group, a hydroxyacenaphthylenyl group, a hydroxyacenaphthenyl group, a hydroxybenzophenanthrenyl group, a hydroxybenzofluoranthenyl group, a hydroxyperylenyl group, a hydroxybenzopyrenyl group, a hydroxynaphthoanthracenyl group, a hydroxybenzoperylenyl group, a hydroxydibenzopyrenyl group, a hydroxycoronenyl group, a substituted or unsubstituted pyrrolyl group, a substituted or unsubstituted indolo group, a substituted or unsubstituted carbazolyl group, a substituted or unsubstituted furanyl group, a substituted or unsubstituted benzofuranyl group, a substituted or unsubstituted dibenzofuranyl group, a substituted or unsubstituted thiophenyl group, a substituted or unsubstituted benzothiophenyl group, a substituted or unsubstituted dibenzothiophenyl group, a substituted or unsubstituted pyridinyl group, a substituted or unsubstituted pyrimidyl group, a substituted or unsubstituted triazinyl group, a substituted or unsubstituted imidazolyl group, a substituted or unsubstituted pyrazolyl group, a substituted or unsubstituted isoindolo group, a substituted or unsubstituted benzimidazolyl group, a substituted or unsubstituted indazolyl group, a substituted or unsubstituted oxazolyl group, a substituted or unsubstituted thiazolyl group, or a combination thereof.

In an implementation, at least one or two of $R^1$ to $R^5$ may be, e.g., a substituted or unsubstituted C3 to C30 heteroaryl group or a C6 to C30 aryl group substituted with a hydroxy group, an amino group, a mercapto group, a substituted or unsubstituted C1 to C30 alkoxy group, a substituted or unsubstituted C1 to C30 alkylthiol group, or a substituted or unsubstituted C1 to C20 alkylamino group.

In an implementation, one or two of $R^1$ to $R^5$ may be, e.g., the substituted or unsubstituted heteroaryl group selected from Group 3 or a substituted aryl group of a group of Group 2 that is substituted with a hydroxy group, an amino group, a mercapto group, a substituted or unsubstituted C1 to C30 alkoxy group, a substituted or unsubstituted C1 to C30 alkylthiol group, or a substituted or unsubstituted C1 to C20 alkylamino group.

In an implementation, one or two of $R^1$ to $R^5$ may be, e.g., a hydroxyphenyl group, a hydroxynaphthyl group, a hydroxyanthracenyl group, a hydroxytetracenyl group, a hydroxypentacenyl group, a hydroxybiphenyl group, a hydroxyterphenyl group, a hydroxyquaterphenyl group, a hydroxyquinquephenyl group, a hydroxyphenanthrenyl group, a hydroxychrysenyl group, a hydroxypicenyl group, a hydroxytriphenylenyl group, a hydroxypyrenyl group, a hydroxyfluorenyl group, a hydroxyfluoranthenyl group, a hydroxyacenaphthylenyl group, a hydroxyacenaphthenyl group, a hydroxybenzophenanthrenyl group, a hydroxybenzofluoranthenyl group, hydroxyperylenyl group, a hydroxybenzopyrenyl group, a hydroxynaphthoanthracenyl group, a hydroxybenzoperylenyl group, a hydroxydibenzopyrenyl group, a hydroxycoronenyl group, a substituted or unsubstituted pyrrolyl group, a substituted or unsubstituted indolo group, a substituted or unsubstituted carbazolyl group, a substituted or unsubstituted furanyl group, a substituted or unsubstituted benzofuranyl group, a substituted or unsubstituted dibenzofuranyl group, a substituted or unsubstituted thiophenyl group, a substituted or unsubstituted benzothiophenyl group, a substituted or unsubstituted dibenzothiophenyl group, a substituted or unsubstituted pyridinyl group, a substituted or unsubstituted pyrimidyl group, a substituted or unsubstituted triazinyl group, a substituted or unsubstituted imidazolyl group, a substituted or unsubstituted pyrazolyl group, a substituted or unsubstituted isoindolo group, a substituted or unsubstituted benzimidazolyl group, a substituted or unsubstituted indazolyl group, a substituted or unsubstituted oxazolyl group, a substituted or unsubstituted thiazolyl group, or a combination thereof.

In an implementation, at least one of $R^1$ to $R^5$ may be, e.g., a C6 to C30 aryl group substituted with a hydroxy group, an amino group, a mercapto group, a substituted or unsubstituted C1 to C30 alkoxy group, a substituted or unsubstituted C1 to C30 alkylthiol group, or a substituted or unsubstituted C1 to C20 alkylamino group, and at least one other one of $R^1$ to $R^5$ may be, e.g., a substituted or unsubstituted C3 to C30 heteroaryl group.

In an implementation, at least one of $R^1$ to $R^5$ may be, e.g., a substituted aryl group of a group of Group 2 that is substituted with a hydroxy group, an amino group, a mercapto group, a substituted or unsubstituted C1 to C30 alkoxy group, a substituted or unsubstituted C1 to C30 alkylthiol group, or a substituted or unsubstituted C1 to C20 alkylamino group, and at least one other one of $R^1$ to $R^5$ may be, e.g., the substituted or unsubstituted heteroaryl group of a group of Group 3.

In an implementation, at least one of $R^1$ to $R^5$ may be, e.g., a hydroxyphenyl group, a hydroxynaphthyl group, a hydroxyanthracenyl group, a hydroxytetracenyl group, a hydroxypentacenyl group, a hydroxybiphenyl group, a hydroxyterphenyl group, a hydroxyquaterphenyl group, a hydroxyquinquephenyl group, a hydroxyphenanthrenyl group, a hydroxychrysenyl group, a hydroxypicenyl group, a hydroxytriphenylenyl group, a hydroxypyrenyl group, a hydroxyfluorenyl group, a hydroxyfluoranthenyl group, a hydroxyacenaphthylenyl group, a hydroxyacenaphthenyl group, a hydroxybenzophenanthrenyl group, a hydroxybenzofluoranthenyl group, a hydroxyperylenyl group, a hydroxybenzopyrenyl group, a hydroxynaphthoanthracenyl group, a hydroxybenzoperylenyl group, a hydroxydibenzopyrenyl group, a hydroxycoronenyl group, or a combination thereof, and at least one other one of $R^1$ to $R^5$ may be, e.g., a substituted or unsubstituted pyrrolyl group, a substituted or unsubstituted indolo group, a substituted or unsubstituted carbazolyl group, a substituted or unsubstituted furanyl group, a substituted or unsubstituted benzofuranyl group, a substituted or unsubstituted dibenzofuranyl group, a substituted or unsubstituted thiophenyl group, a substituted or unsubstituted benzothiophenyl group, a substituted or unsubstituted dibenzothiophenyl group, a substituted or unsubstituted pyridinyl group, a substituted or unsubstituted pyrimidyl group, a substituted or unsubstituted triazinyl group, a substituted or unsubstituted imidazolyl group, a substituted or unsubstituted pyrazolyl group, a substituted or unsubstituted isoindolo group, a substituted or unsubstituted benzimidazolyl group, a substituted or unsubstituted indazolyl group, a substituted or unsubstituted oxazolyl group, a substituted or unsubstituted thiazolyl group, or a combination thereof.

In an implementation, $R^1$ to $R^5$ may be separate or adjacent two of $R^1$ to $R^5$ may be linked with each other to form a ring. In an implementation, two adjacent groups of $R^1$ to $R^5$ may be linked by a single bond or double bond, or adjacent two of $R^1$ to $R^5$ may be fused to form a ring.

In an implementation, $R^1$ to $R^5$ may not be all hydrogen, or only one thereof may be hydrogen. For example, a carbon content of the compound may be further increased, thereby forming a rigid layer and providing high etch resistance.

In an implementation, $R^5$ may be hydrogen.

In an implementation, $R^5$ may be hydrogen and $R^2$ and/or $R^3$ may be, e.g., a C3 to C30 heteroaryl group; or a C6 to C30 aryl group substituted with a hydroxy group, an amino group, a mercapto group, a substituted or unsubstituted C1 to C30 alkoxy group, a substituted or unsubstituted C1 to C30 alkylthiol group, or a substituted or unsubstituted C1 to C20 alkylamino group.

In an implementation, the group represented by Chemical Formula 2 may be, e.g., a group represented by one of Chemical Formulae 3-1 to 3-5.

[Chemical Formula 3-1]

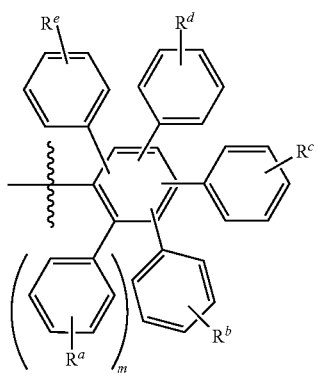

[Chemical Formula 3-2]

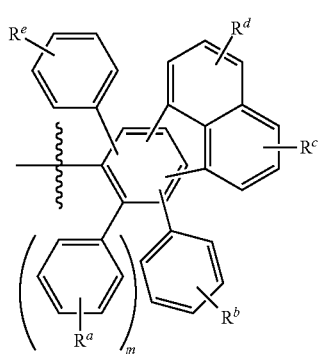

[Chemical Formula 3-3]

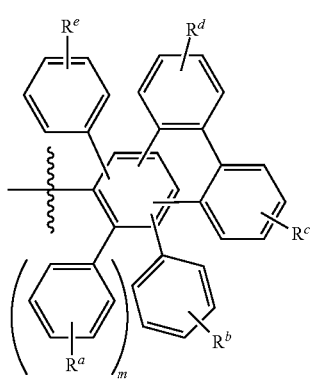

[Chemical Formula 3-4]

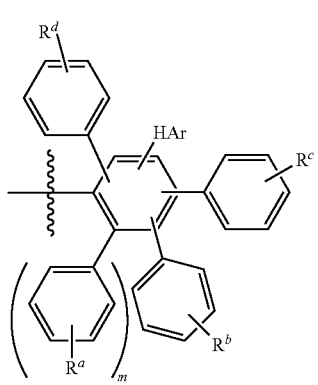

[Chemical Formula 3-5]

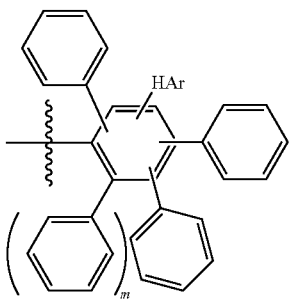

In Chemical Formulae 3-1 to 3-5, $R^a$ to $R^e$ may each independently be, e.g., hydrogen, a hydroxy group, an amino group, a mercapto group, a substituted or unsubstituted C1 to C30 alkoxy group, a substituted or unsubstituted C1 to C30 alkylthiol group, or a substituted or unsubstituted C1 to C20 alkylamino group.

In an implementation, at least one of $R^a$ to $R^e$ may be, e.g., a hydroxy group, an amino group, a mercapto group, a substituted or unsubstituted C1 to C30 alkoxy group, a substituted or unsubstituted C1 to C30 alkylthiol group, or a substituted or unsubstituted C1 to C20 alkylamino group.

HAr may be, e.g., a substituted or unsubstituted C3 to C30 heteroaryl group including at least one of N, O, and S.

m may be, e.g., 0 or 1.

" 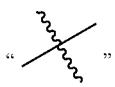 "

is a linking point with A in Chemical Formula 1.

In an implementation, the group represented by one of Chemical Formulae 3-1 to 3-5 may each independently be further substituted with, e.g., a hydroxy group, a C1 to C30 alkyl group, a C1 to C30 alkoxy group, a C2 to C30 alkenyl group, a C2 to C30 alkynyl group, a C6 to C30 aryl group, a C7 to C30 arylalkyl group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C2 to C30 heterocyclic group, a C1 to C30 ester group, a C0 to C30 amino group, a C1 to C30 thioester group, a C1 to C30 sulfone group, a halogen, or a combination thereof.

In an implementation, at least one of $R^b$ to $R^e$ may be a hydroxy group.

In an implementation, one or two of $R^a$ to $R^e$ may be a hydroxy group.

In an implementation, one or two of $R^b$ to $R^e$ may be a hydroxy group.

In an implementation, HAr may be, e.g., a substituted or unsubstituted six-membered (e.g., hexagonal) heteroaryl group including at least one N. In an implementation, HAr may be, e.g., a substituted or unsubstituted pyridinyl group, a substituted or unsubstituted pyrimidyl group, or a substituted or unsubstituted triazinyl group.

In an implementation, the group represented by Chemical Formula 2 may be, e.g., a group represented by one of Chemical Formulae 3-1-1 to 3-6-1.

[Chemical Formula 3-1-1]

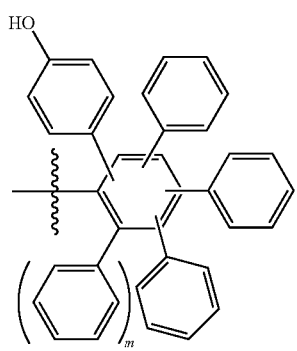

[Chemical Formula 3-2-1]

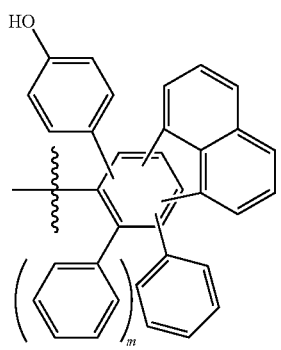

[Chemical Formula 3-3-1]

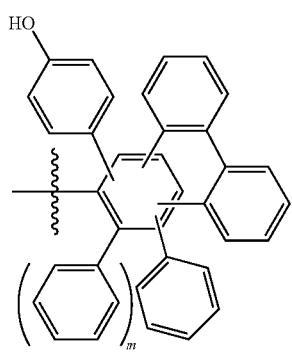

[Chemical Formula 3-4-1]

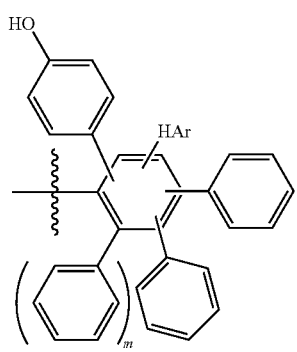

[Chemical Formula 3-5-1]

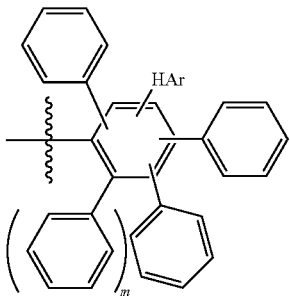

[Chemical Formula 3-6-1]

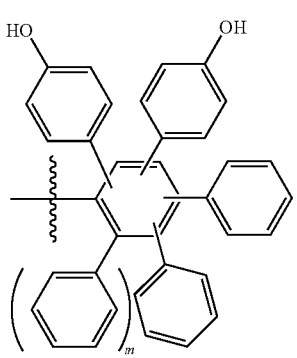

In Chemical Formulae 3-1-1 to 3-6-1, HAr and m are the same as described above.

In an implementation, n may be an integer satisfying the following relation: $2 \leq n \leq k/2$, in which k may be the number of substituted or substitutable positions of A in Chemical Formula 1.

In an implementation, when A is a substituted or unsubstituted benzene moiety, n may be 2 or 3, when A is a substituted or unsubstituted naphthalene moiety, n may be an integer of 2 to 4, when A is a substituted or unsubstituted anthracene moiety, n may be an integer of 2 to 5, when A is a substituted or unsubstituted pyrene moiety, n may be an integer of 2 to 5, when A is a substituted or unsubstituted triphenylene moiety, n may be an integer of 2 to 6, when A is a substituted or unsubstituted biphenyl moiety, n may be an integer of 2 to 5, and when A is a substituted or unsubstituted terphenyl moiety, n may be an integer of 2 to 7.

In an implementation, A may be an integer of 2 to 4, e.g., 2 or 3.

In an implementation, the compound represented by Chemical Formula 1 may be represented by, e.g., one of Chemical Formulae 4-1 to 4-4.

[Chemical Formula 4-1]

[Chemical Formula 4-2]

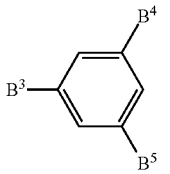

[Chemical Formula 4-3]

[Chemical Formula 4-4]

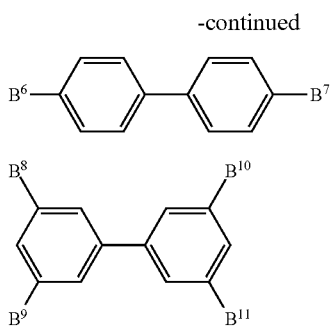

In Chemical Formula 4-1 to Chemical Formula 4-4, $B^1$ to $B^{11}$ may each independently be, e.g., a group represented by Chemical Formula 2, as described above.

In an implementation, $B^1$ and $B^2$ may be the same or different, $B^3$ to $B^5$ may be the same or different, $B^6$ and $B^7$ may be the same or different, and $B^8$ to $B^{11}$ may be the same or different.

In an implementation, the compound represented by Chemical Formula 1 may have a molecular weight of, e.g. about 700 to about 10,000, about 800 to about 7,000, about 900 to about 3,000, or about 1,000 to about 2,000.

When the compound having a molecular weight within the range is used, a more uniform thin film may not only be formed without forming a pin-hole and a void or deteriorating a thickness distribution during the baking process, but in addition, when there is a step in a lower substrate (or a film) or when a pattern is formed, further excellent gap-fill and planarization characteristics may be provided.

In an implementation, the solvent included in the hardmask composition may have sufficient dissolution or dispersion with respect to the compound. In an implementation, the solvent may include, e.g.,propylene glycol, propylene glycol diacetate, methoxy propanediol, diethylene glycol, diethylene glycol butylether, tri(ethylene glycol)monomethylether, propylene glycol monomethylether, propylene glycol monomethylether acetate, cyclohexanone, ethyllactate, gamma-butyrolactone, N,N-dimethyl formamide, N,N-dimethyl acetamide, methylpyrrolidone, methylpyrrolidinone, acetylacetone, or ethyl 3-ethoxypropionate.

In an implementation, the compound may be included in the composition in an amount of about 0.1 wt % to about 50 wt %, e.g. about 0.5 wt % to about 40 wt %, about 1 wt % to about 30 wt %, or about 3 wt % to about 20 wt %, based on a total weight of the hardmask composition. When the compound is included within the range, a thickness, surface roughness and planarization of the hardmask may be controlled.

In an implementation, the hardmask composition may further include an additive, e.g., a surfactant, a cross-linking agent, a thermal acid generator, a plasticizer, or the like.

In an implementation, the surfactant may include, e.g., a fluoroalkyl-based compound, an alkylbenzene sulfonate salt, an alkyl pyridinium salt, polyethylene glycol, or a quaternary ammonium salt.

In an implementation, the cross-linking agent may be, e.g., a melamine-based, substituted urea-based, or a polymer-based cross-linking agent. In an implementation, it may be a cross-linking agent having at least two cross-linking forming substituents, e.g., a compound such as methoxymethylated glycoluril, butoxymethylated glycoluril, methoxymethylated melamine, butoxymethylated melamine, methoxymethylated benzoguanamine, butoxymethylated benzoguanamine, methoxymethylatedurea, butoxymethylatedurea, methoxymethylated thiourea, or butoxymethylated thiourea, or the like.

The cross-linking agent may be a cross-linking agent having high heat resistance. The cross-linking agent having high heat resistance may be a compound including a cross-linking substituent including an aromatic ring (e.g. a benzene ring or a naphthalene ring) in the molecule.

In an implementation, the thermal acid generator may be, e.g., an acidic compound such as p-toluene sulfonic acid, trifluoromethanesulfonic acid, pyridiniumptoluenesulfonic acid, salicylic acid, sulfosalicylic acid, citric acid, benzoic acid, hydroxybenzoic acid, naphthalenecarbonic acid, or the like, 2,4,4,6-tetrabromocyclohexadienone, benzointosylate, 2-nitrobenzyltosylate, other organosulfonic acid alkylester, or the like.

The additive may be included in an amount of, e.g., about 0.001 parts by weight to about 40 parts by weight, about 0.01 parts by weight to about 30 parts by weight, or about 0.1 parts by weight to about 20 parts by weight, based on 100 parts by weight of the hardmask composition. Within the ranges, solubility may be improved while optical properties of the hardmask composition are not changed.

According to another embodiment, an organic layer manufactured using the aforementioned hardmask composition may be provided. The organic layer may be, e.g., formed by coating the aforementioned hardmask composition on a substrate and heat-treating it for curing and may include, e.g., a hardmask layer, a planarization layer, a sacrificial layer, a filler, and the like, for an electronic device.

In an implementation, a hardmask layer including a cured product of the aforementioned hardmask composition is provided.

In an implementation, the cured product may include a condensed polycyclic aromatic hydrocarbon.

In an implementation, the condensed polycyclic aromatic hydrocarbon may include, e.g., a substituted or unsubstituted naphthalene, a substituted or unsubstituted anthracene, a substituted or unsubstituted phenanthrene, a substituted or unsubstituted naphthacene, a substituted or unsubstituted pyrene, a substituted or unsubstituted benzopyrene, a substituted or unsubstituted chrysene, a substituted or unsubstituted triphenylene. a substituted or unsubstituted perylene, a substituted or unsubstituted benzofluoranthene, substituted or unsubstituted benzoperylene, a substituted or unsubstituted coronene, a combination thereof, or a combined fused ring of the foregoing groups.

In an implementation, the cured product may further include a heterocycle.

The cured product may include the condensed polycyclic aromatic hydrocarbons, which may withstand the etching gases and chemicals exposed in subsequent processes, including the etching process due to high etch resistance and chemical resistance.

Hereinafter, a method of forming a pattern using the aforementioned hardmask composition is described.

A method of forming patterns according to an embodiment may include forming a material layer on a substrate, applying the hardmask composition including the compound and a solvent on the material layer, heat-treating the hardmask composition to form a hardmask layer, forming a photoresist layer on the hardmask layer, exposing and developing the photoresist layer to form a photoresist pattern, selectively removing the hardmask layer using the photoresist pattern to expose a portion of the material layer, and etching an exposed portion of the material layer.

The substrate may be, e.g., a silicon wafer, a glass substrate, or a polymer substrate.

The material layer is a material to be finally patterned, e.g., a metal layer such as an aluminum layer and a copper layer, a semiconductor layer such as a silicon layer, or an insulation layer such as a silicon oxide layer and a silicon nitride layer. The material layer may be formed through a suitable method, e.g., a chemical vapor deposition (CVD) process.

The hardmask composition is the composition according to an embodiment as described above, and may be applied by spin-on coating in a form of a solution. In an implementation, an application thickness of the hardmask composition may be, e.g., about 50 Å to about 200,000 Å.

The heat-treating of the hardmask composition may be performed, e.g., at about 100° C. to about 700° C. for about 10 seconds to about 1 hour.

In an implementation, the method may further include forming a silicon-containing thin layer on the hardmask layer. In an implementation, the silicon-containing thin layer may be formed of a material, e.g., SiCN, SiOC, SiON, SiOCN, SiC, SiO, SiN, or the like.

In an implementation, the method may further include forming a bottom antireflective coating (BARC) on the upper surface of the silicon-containing thin layer or on the upper surface hardmask layer before forming the photoresist layer.

Exposure of the photoresist layer may be performed using, e.g. ArF, KrF, or EUV. After exposure, heat-treating may be performed at about 100° C. to about 700° C.

The etching process of the exposed portion of the material layer may be performed through a dry etching process using an etching gas and the etching gas may be, e.g., $CHF_3$, $CF_4$, $Cl_2$, $BCl_3$, and a mixed gas thereof.

The etched material layer may be formed in a plurality of patterns, and the plurality of patterns may be a metal pattern, a semiconductor pattern, an insulation pattern, or the like, e.g., diverse patterns of a semiconductor integrated circuit device.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Preparation of Hardmask Composition

EXAMPLE 1

A stirring bar was put in a 100 mL 1-neck round-bottomed flask, and then, acecyclone (7.13 g), 1,4-di[2-(4-hydroxyphenyl)ethynyl]benzene (3.10 g), and 1-methyl-2-pyrrolidone (19.3 g) were put therein and stirred for 12 hours, while refluxing, to obtain a compound represented by Chemical Formula 1a.

Subsequently, the mixture was cooled down to ambient temperature and then, diluted with cyclohexanone (45.1 g) to prepare a hardmask composition.

[Chemical Formula 1a]

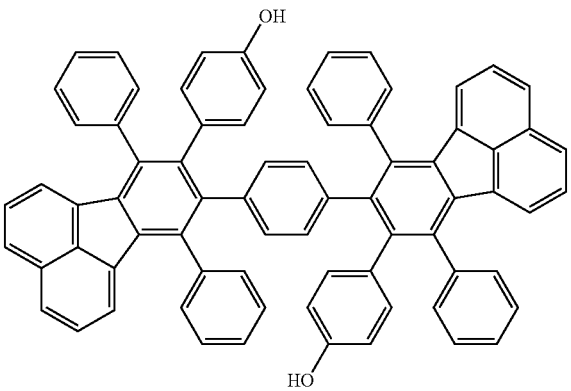

EXAMPLE 2

A stirring bar was put in a 100 mL 1-neck round-bottomed flask, and then, cyclone (7.69 g), 1,4-di[2-(4-hydroxyphenyl)ethynyl]benzene (3.10 g), and 1-methyl-2-pyrrolidone (20.5 g) were put therein and stirred for 12 hours, while refluxing, to obtain a compound represented by Chemical Formula 2a.

Subsequently, the mixture was cooled down to ambient temperature and then, diluted with cyclohexanone (47.7 g) to prepare a hardmask composition.

[Chemical Formula 2a]

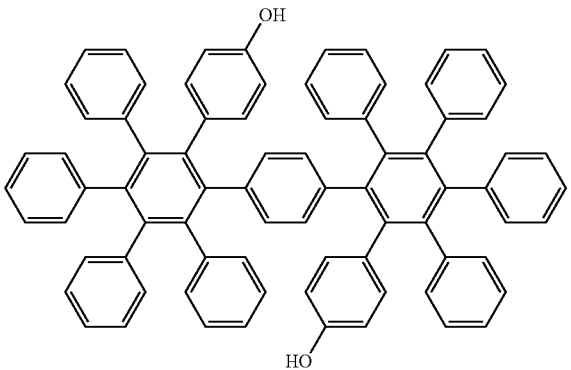

EXAMPLE 3

A stirring bar was put in a 100 mL 1-neck round-bottomed flask, and then, phencyclone (7.65 g), 1,4-di[2-(4-hydroxyphenyl)ethynyl]benzene (3.10 g), and 1-methyl-2-pyrrolidone (20.4 g) were put therein and stirred for 12 hours, while refluxing, to obtain a compound represented by Chemical Formula 3a.

Subsequently, the mixture was cooled down to ambient temperature and then, diluted with cyclohexanone (47.5 g) to prepare a hardmask composition.

[Chemical Formula 3a]

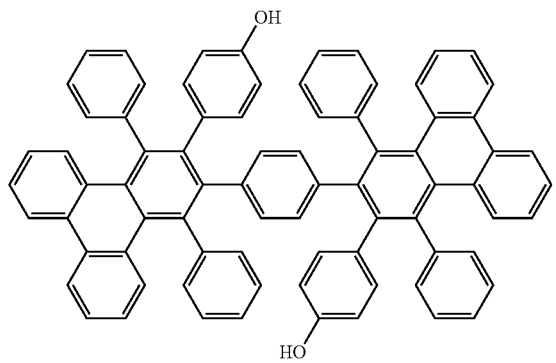

EXAMPLE 4

A stirring bar was put in a 100 mL 1-neck round-bottomed flask, and then, 2,3,5-triphenyl-4-(4-hydroxyphenyl)-2,4-cyclopentadiene-1-one (8.01 g), 1,4-di(2-phenylethynyl)benzene (2.78 g), and 1-methyl-2-pyrrolidone (20.5 g) were put therein and stirred for 12 hours, while refluxing, to obtain a compound represented by Chemical Formula 4a.

Subsequently, the mixture was cooled down to ambient temperature and then, diluted with cyclohexanone (47.7 g) to prepare a hardmask composition.

[Chemical Formula 4a]

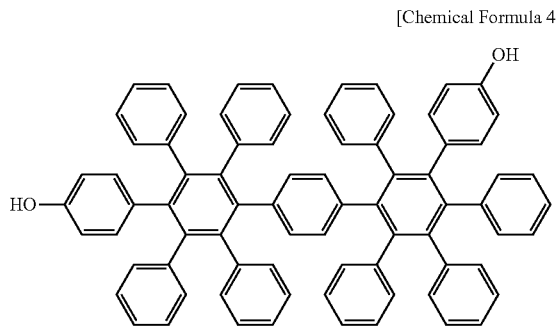

EXAMPLE 5

A stirring bar was put in a 100 mL 1-neck round-bottomed flask, and then, 2,3,5-triphenyl-4-(4-hydroxyphenyl)-2,4-cyclopentadiene-1-one (8.01 g), 1,4-di[2-(4-hydroxyphenyl)ethynyl]benzene (3.10 g), and 1-methyl-2-pyrrolidone (21.1 g) were put therein and stirred for 12 hours, while refluxing, to obtain a compound represented by Chemical Formula 5a.

Subsequently, the mixture was cooled down to ambient temperature and then, diluted with cyclohexanone (49.2 g) to prepare a hardmask composition.

[Chemical Formula 5a]

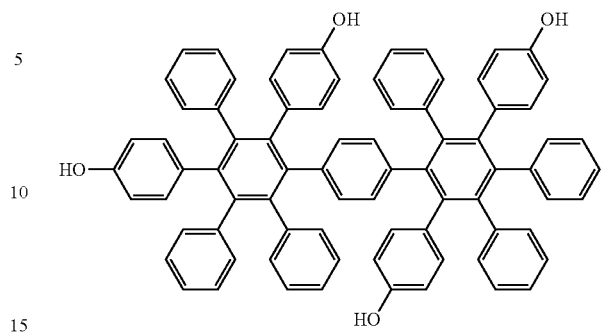

EXAMPLE 6

A stirring bar was put in a 100 mL 1-neck round-bottomed flask, and then, 2,3,5-triphenyl-4-(5-pyrimidyl)-2,4-cyclopentadiene-1-one (7.73 g), 1,4-di[2-(4-hydroxyphenyl)ethynyl]benzene (3.10 g), and 1-methyl-2-pyrrolidone (20.5 g) were put therein and stirred for 12 hours, while refluxing, to obtain a compound represented by Chemical Formula 6a.

Subsequently, the mixture was cooled down to ambient temperature and then, diluted with cyclohexanone (48.0 g) to prepare a hardmask composition.

[Chemical Formula 6a]

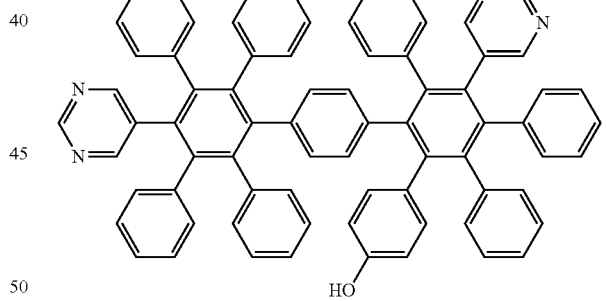

EXAMPLE 7

A stirring bar was put in a 100 mL 1-neck round-bottomed flask, and then, phenecyclone (7.65 g), 4,4'-di[2-(4-hydroxyphenyl)ethynyl]biphenyl (3.86 g), and 1-methyl-2-pyrrolidone (21.9 g) were put therein and stirred for 12 hours, while refluxing, to obtain a compound represented by Chemical Formula 7a.

Subsequently, the mixture was cooled down to ambient temperature and then, diluted with cyclohexanone (51.1 g) to prepare a hardmask composition.

[Chemical Formula 7a]

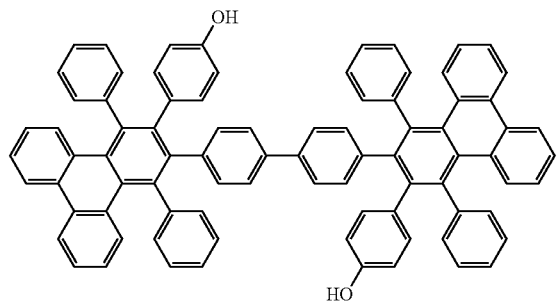

EXAMPLE 8

A stirring bar was put in a 100 mL 1-neck round-bottomed flask, and then, 2,3,5-triphenyl-4-(4-hydroxyphenyl)-2,4-cyclopentadiene-1-one (8.01 g), 1,4-diethynylbenzene (1.26 g), and m-xylene (17.4 g) were put therein and stirred for 12 hours, while refluxing, to obtain a compound represented by Chemical Formula 8a.

Subsequently, the mixture was cooled down to ambient temperature and then, diluted with cyclohexanone (40.7 g) to prepare a hardmask composition.

[Chemical Formula 8a]

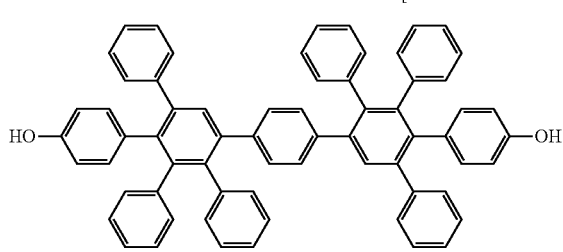

EXAMPLE 9

A stirring bar was put in a 100 mL 1-neck round-bottomed flask, and then, 2,3,5-triphenyl-4-(4-hydroxyphenyl)-2,4-cyclopentadiene-1-one (12.0 g), 1,3,5-triethynylbenzene (1.50 g), and m-xylene (25.4 g) were put therein and stirred for 12 hours, while refluxing, to obtain a compound represented by Chemical Formula 9a.

Subsequently, the mixture was cooled down to ambient temperature and then, diluted with cyclohexanone (59.1 g) to prepare a hardmask composition.

[Chemical Formula 9a]

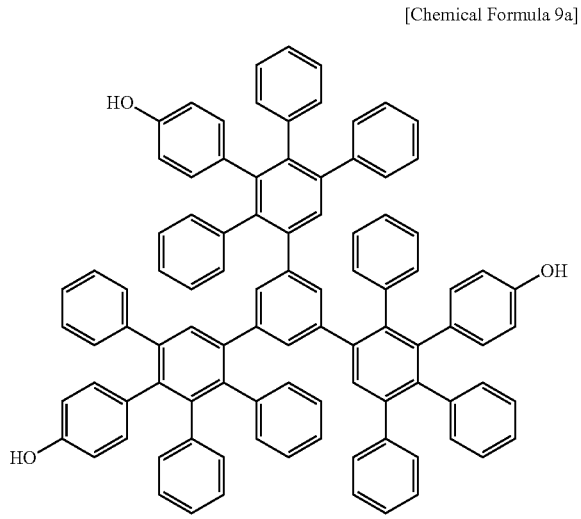 [SMILES: Oc1ccc(-c2c(-c3ccccc3)cc(-c3cc(-c4cc(-c5ccccc5)c(-c5ccccc5)c(-c5ccc(O)cc5)c4-c4ccccc4)cc(-c4cc(-c5ccccc5)c(-c5ccccc5)c(-c5ccc(O)cc5)c4-c4ccccc4)c3)c(-c3ccccc3)c2-c2ccccc2)cc1]

EXAMPLE 10

A stirring bar was put in a 100 mL 1-neck round-bottomed flask, and then, 2,3,5-triphenyl-4-(4-hydroxyphenyl)-2,4-cyclopentadiene-1-one (16.0 g), 3,3',5,5'-tetraethynyl-1,1'-biphenyl (1.50 g), and m-xylene (34.8 g) were put therein and stirred for 12 hours, while refluxing, to obtain a compound represented by Chemical Formula 10a.

Subsequently, the mixture was cooled down to ambient temperature and then, diluted with cyclohexanone (81.2 g) to prepare a hardmask composition.

[Chemical Formula 10a]

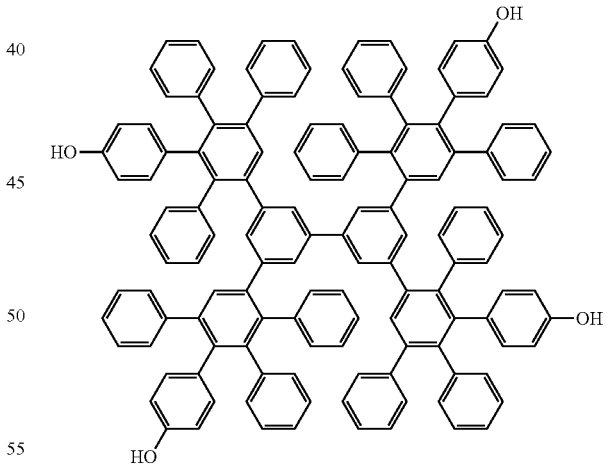

COMPARATIVE EXAMPLE 1

A stirring bar was put in a 100 mL 1-neck round-bottomed flask, and then, cyclone (3.84 g), 2,3,5-triphenyl-4-[4-(2-phenylethynyl)phenyl]-2,4-cyclopentadiene-1-one (19.4 g), diphenylacetylene (1.78 g), and 1-methyl-2-pyrrolidone (37.5 g) were put therein and stirred for 20 hours, while refluxing, to obtain a polymer represented by Chemical Formula A (MW 2,361).

Subsequently, the mixture was cooled down to ambient temperature and then, diluted with 1-methoxy-2-propyl acetate (62.6 g) to prepare a hardmask composition.

[Chemical Formula A]

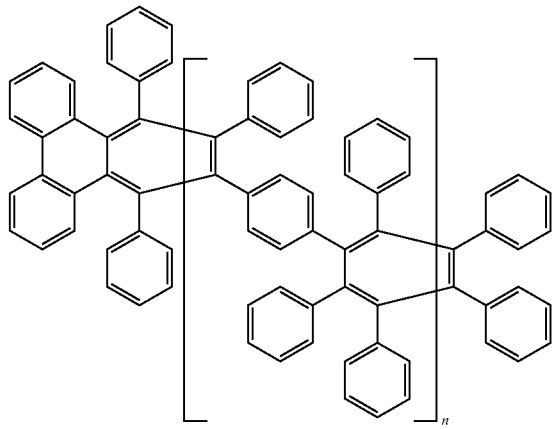

COMPARATIVE EXAMPLE 2

A stirring bar was put in a 100 mL 1-neck round-bottomed flask, and then, cyclone (7.68 g), 2,5-diphenyl-3,4-di[4-(2-phenylethynyl)phenyl]-2,4-cyclopentadiene-1-one (17.5 g), diphenylacetylene (1.78 g), and 1-methyl-2-pyrrolidone (34.7 g) were put therein and stirred for 20 hours, while refluxing, to obtain a polymer represented by Chemical Formula B (MW 2,205).

Subsequently, the mixture was cooled down to ambient temperature and then, diluted with 1-methoxy-2-propyl acetate (57.8 g) to prepare a hardmask composition.

[Chemical Formula B]

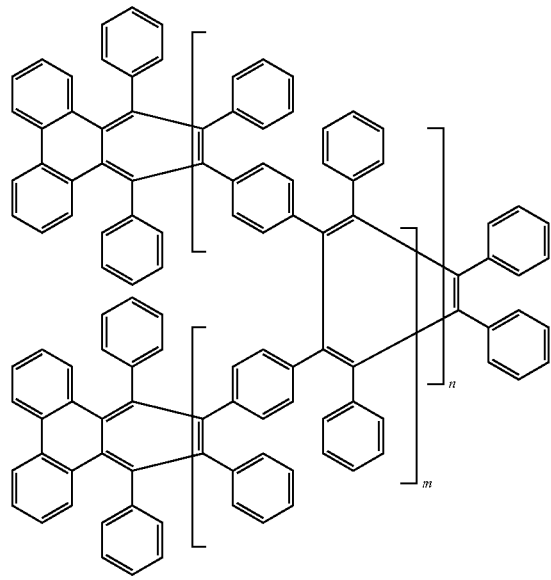

Formation of Organic Layer

The hardmask compositions according to Examples 1 to 10 and Comparative Examples 1 and 2 were respectively spin-coated on a silicon wafer and then, heat-treated at 500° C. for 2 minutes under a nitrogen atmosphere to form a 4,000 Å-thick organic layer.

Evaluation 1: Evaluation of Etch Resistance

Thicknesses of organic layers respectively formed of the hardmask compositions according to Examples 1 to 10 and Comparative Examples 1 and 2 were measured. Subsequently, the organic layers were dry-etched by using $CF_x$ mixed gas for 100 seconds, and then, thicknesses thereof were measured again.

The thicknesses of the organic layers before and after the dry etching and their etching times were used to calculate a bulk etch rate (BER) according to Calculation Equation 1.

Etch rate (Å/s)=(Initial thickness of organic layer−thickness of organic layer after etching)/etching time [Calculation Equation 1]

The results are shown in Table 1.

TABLE 1

|  | $CF_x$ Bulk etch rate (Å/s) |
| --- | --- |
| Example 1 | 18.3 |
| Example 2 | 18.4 |
| Example 3 | 18.1 |
| Example 4 | 18.4 |
| Example 5 | 18.5 |
| Example 6 | 18.0 |
| Example 7 | 18.8 |
| Example 8 | 19.0 |
| Example 9 | 17.8 |
| Example 10 | 17.5 |
| Comparative Example 1 | 20.1 |
| Comparative Example 2 | 21.3 |

Referring to Table 1, the organic layers of Examples 1 to 10 exhibited sufficient etch resistance against etching gas and thus improved etch resistance, compared with those of Comparative Examples 1 and 2.

Evaluation 2: Evaluation of Chemical Resistance

Each thickness of the organic layers formed using the hardmask compositions according to Examples 1 to 10, Comparative Example 1, and Comparative Example 2 was measured. Subsequently, after treating the organic layers with a KrF thinner for 1 minute, each thickness of the residual organic layers was measured again. (KrF thinner: ethyl 3-ethoxypropionate (EEP)/ethyl lactate (EL)/gamma-butyrolactone (GBL)=75/20/5)

The results are shown in Table 2.

TABLE 2

|  | KrF thinner chemical resistance |
| --- | --- |
| Example 1 | ○ |
| Example 2 | ○ |
| Example 3 | ○ |
| Example 4 | ○ |
| Example 5 | ○ |
| Example 6 | ○ |
| Example 7 | ○ |
| Example 8 | ○ |
| Example 9 | ○ |
| Example 10 | ○ |
| Comparative Example 1 | X |
| Comparative Example 2 | X |

○: a thickness of a residual organic layer was greater than or equal to 80% of an initial thickness of an organic layer X: less than 80% of a residual organic layer was greater than or equal to 80% of an initial thickness of an organic layer Referring to Table 2, the organic layers according to Examples 1 to 10 exhibited improved chemical resistance against a KrF thinner, compared with the organic layers according to Comparative Example 1 and Comparative Example 2.

By way of summation and review, according to small-sizing the pattern to be formed, it could be difficult to provide a fine pattern having an excellent profile by using some lithographic techniques. For example, an auxiliary layer, called a hardmask layer, may be formed between the material layer and the photoresist layer to provide a fine pattern.

One or more embodiments may provide a hardmask composition capable of improving etch resistance and chemical resistance.

Etch resistance and chemical resistance of the hardmask layer may be simultaneously secured.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A hardmask composition, comprising:
a solvent; and
a compound represented by Chemical Formula 1,

[Chemical Formula 1]

A—(B)$_n$ wherein, in Chemical Formula 1,
A is a C6 to C30 aromatic moiety,
n is an integer of 2 or more, and
each B is independently a group represented by Chemical Formula 2,

[Chemical Formula 2]

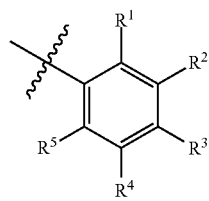

wherein, in Chemical Formula 2,

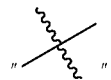

is a linking point with A in Chemical Formula 1, and $R^1$ to $R^5$ are each independently hydrogen, a substituted or unsubstituted aryl group of Group 2, or an unsubstituted heteroaryl group of Group 3, in which the substituted or unsubstituted aryl groups of Group 2 are separate or an adjacent two thereof are linked with each other to form a ring and the unsubstituted heteroaryl groups of Group 3 are separate, at least one of $R^1$ to $R^5$ being a substituted or unsubstituted aryl group of Group 2 or an unsubstituted heteroaryl group of Group 3:

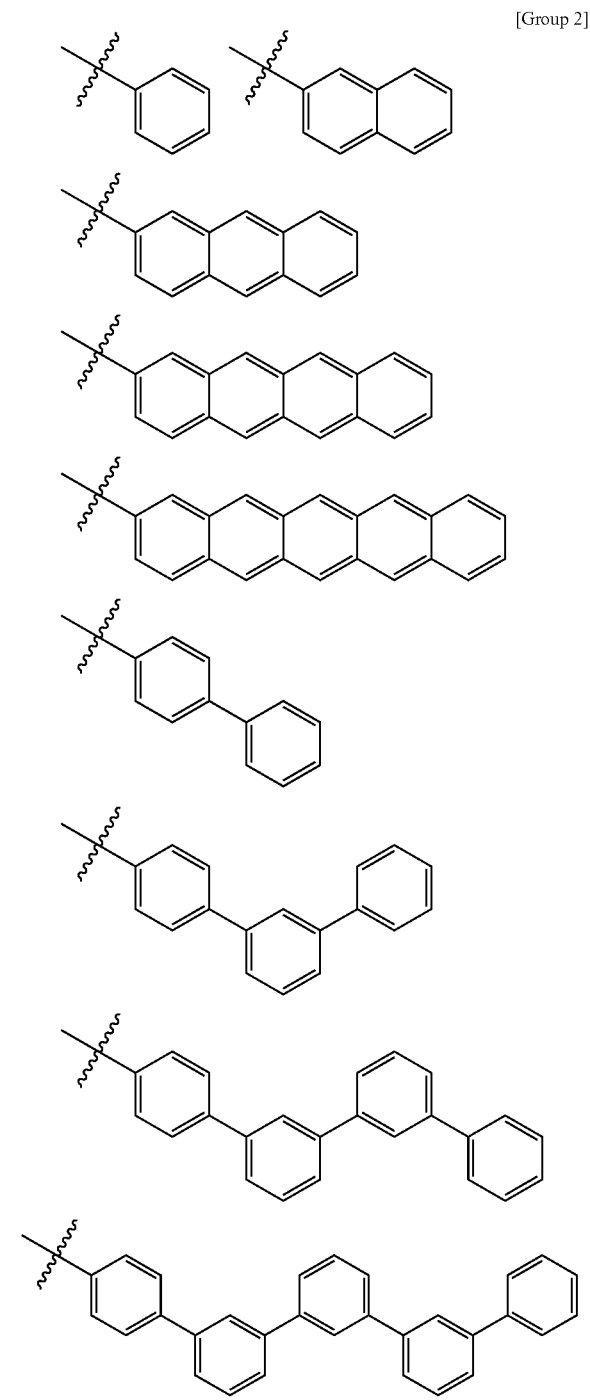

[Group 2]

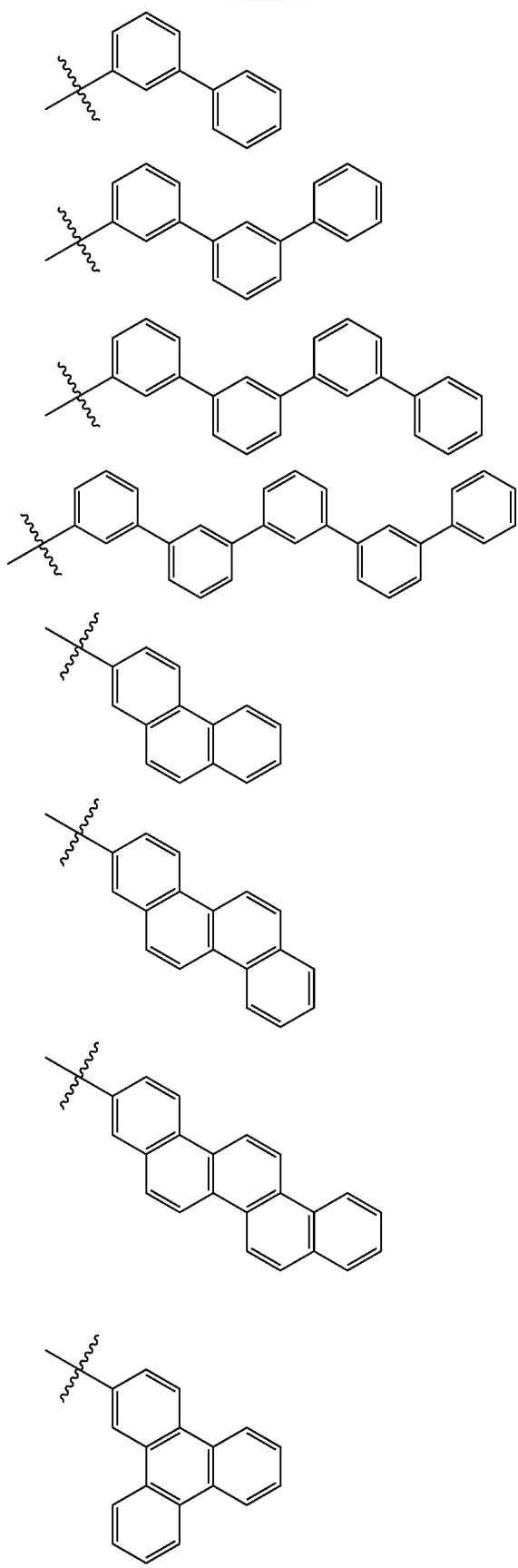
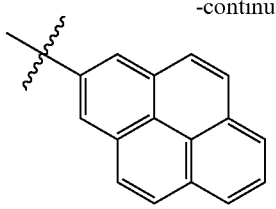
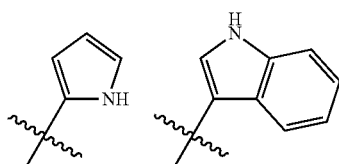

[Group 3]

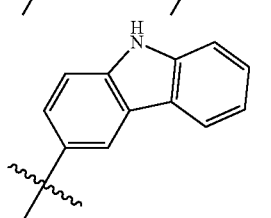
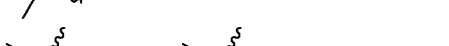
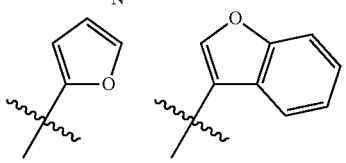
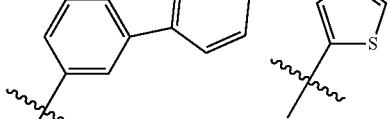
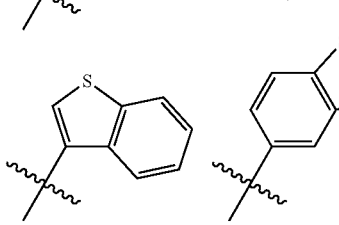
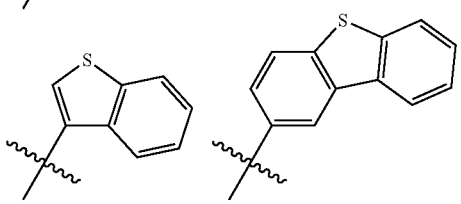

wherein, in Group 2 and Group 3,

is a linking point.

2. The hardmask composition as claimed in claim 1, wherein A is a benzene moiety, a naphthalene moiety, an anthracene moiety, a tetracene moiety, a pentacene moiety, a biphenyl moiety, a terphenyl moiety, a quaterphenyl moiety, a quinquephenyl moiety, a phenanthrene moiety, a pyrene moiety, a fluoranthene moiety, a benzophenanthrene moiety, a chrysene moiety, a perylene moiety, a benzopyrene moiety, a picene moiety, a benzofluoranthene moiety, a dibenzofluoranthene moiety, a benzoperylene moiety, a coronene moiety, a naphthoanthracene moiety, or a triphenylene moiety.

3. The hardmask composition as claimed in claim 1, wherein A is a moiety of a compound of Group 1:

[Group 1]

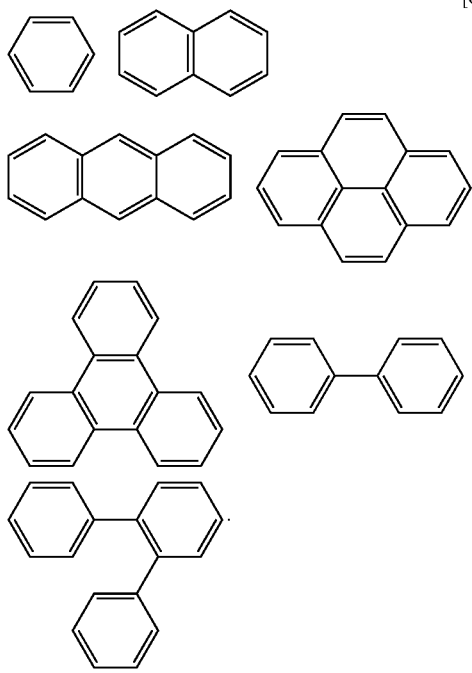

4. The hardmask composition as claimed in claim 1, wherein at least one of $R^1$ to $R^5$ is:

an unsubstituted heteroaryl group of Group 3; or an aryl group of Group 2 substituted with a hydroxy group, an amino group, a mercapto group, a substituted or unsubstituted C1 to C30 alkoxy group, a substituted or unsubstituted C1 to C30 alkylthiol group, or a substituted or unsubstituted C1 to C20 alkylamino group.

5. The hardmask composition as claimed in claim 1, wherein the group represented by Chemical Formula 2 is represented by one of Chemical Formulae 3-1 to 3-5:

[Chemical Formula 3-1]

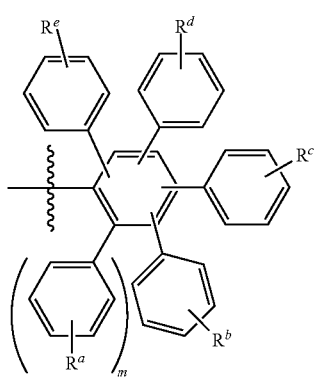

[Chemical Formula 3-2]

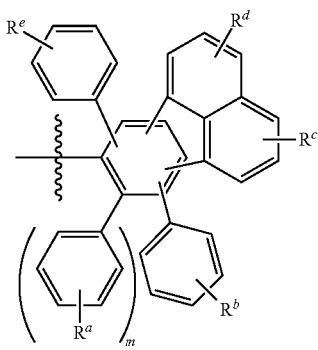

[Chemical Formula 3-3]

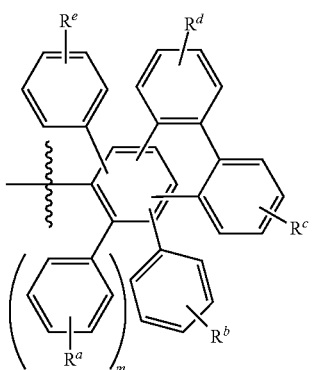

[Chemical Formula 3-4]

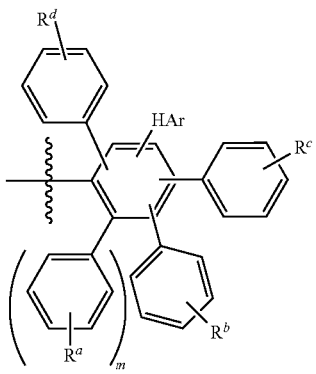

[Chemical Formula 3-5]

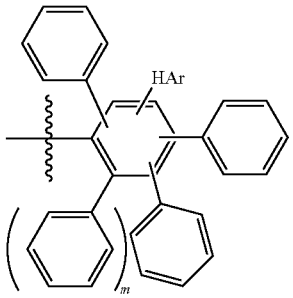

wherein, in Chemical Formulae 3-1 to 3-5, $R^a$ to $R^e$ are each independently hydrogen, a hydroxy group, an amino group, a mercapto group, a substituted or unsubstituted C1 to C30 alkoxy group, a substituted or unsubstituted C1 to C30 alkylthiol group, or a substituted or unsubstituted C1 to C20 alkylamino group, at least one of $R^a$ to $R^e$ is a hydroxy group, an amino group, a mercapto group, a substituted or unsubstituted C1 to C30 alkoxy group, a substituted or unsubstituted C1 to C30 alkylthiol group, or a substituted or unsubstituted C1 to C20 alkylamino group, HAr is an unsubstituted heteroaryl group of Group 3, m is 0 or 1, and

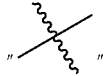

is a linking point with A in Chemical Formula 1.

6. The hardmask composition as claimed in claim 1, wherein n is an integer satisfying 2≤n≤k/2, in which k is a number of substitutable positions of A in Chemical Formula 1.

7. The hardmask composition as claimed in claim 1, wherein the compound represented by Chemical Formula 1 is represented by one of Chemical Formulae 4-1 to 4-4:

[Chemical Formula 4-1]

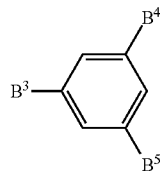

[Chemical Formula 4-2]

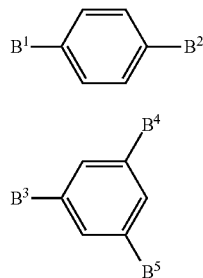

[Chemical Formula 4-3]

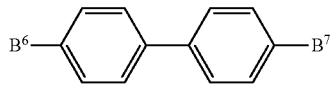

[Chemical Formula 4-4]

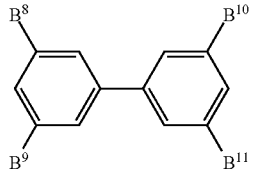

wherein, in Chemical Formula 4-1 to Chemical Formula 4-4, $B^1$ to $B^{11}$ are each independently a group represented by Chemical Formula 2.

8. A hardmask layer comprising a cured product of the hardmask composition as claimed in claim 1.

9. The hardmask layer as claimed in claim 8, wherein the cured product includes a condensed polycyclic aromatic hydrocarbon.

10. A method of forming patterns, the method comprising:
applying the hardmask composition as claimed in claim 1 on a material layer and heat- treating the resultant to form a hardmask layer;
forming a photoresist layer on the hardmask layer;
exposing and developing the photoresist layer to form a photoresist pattern;
selectively removing the hardmask layer using the photoresist pattern to expose a portion of the material layer; and
etching an exposed portion of the material layer.

\* \* \* \* \*